United States Patent [19]
Kumagai et al.

[11] Patent Number: 5,410,729
[45] Date of Patent: Apr. 25, 1995

[54] SIGNAL TRANSMISSION DEVICE HAVING AN AUTOMATIC TRANSMISSION LEVEL CONTROL CIRCUIT USED IN A MULTI-CARRIER TRANSMISSION TERMINAL EQUIPMENT AND MULTI-CARRIER TRANSMISSION TERMINAL EQUIPMENT EMPLOYING THE TRANSMISSION DEVICE

[75] Inventors: Yoshiaki Kumagai; Yoichi Endo, both of Kawasaki, Japan

[73] Assignee: Fujitsu Limited, Kanagawa, Japan

[21] Appl. No.: 112,557

[22] Filed: Aug. 26, 1993

[30] Foreign Application Priority Data

Aug. 26, 1992 [JP] Japan .................. 4-226802

[51] Int. Cl.$^6$ .............................. H04B 1/04
[52] U.S. Cl. ........................ 455/12.1; 455/103; 455/116; 455/126; 330/254; 330/278; 330/284
[58] Field of Search ............... 330/129, 127, 138, 144, 330/254, 278, 284; 455/115, 116, 117, 126, 127, 103, 12.1; 375/98, 58, 60, 76

[56] References Cited

U.S. PATENT DOCUMENTS

| | | | |
|---|---|---|---|
| 4,574,252 | 3/1986 | Slack | 330/278 |
| 4,991,164 | 2/1991 | Casiraghi et al. | 375/98 |
| 4,992,753 | 2/1991 | Jenson et al. | 330/129 |
| 5,287,555 | 2/1994 | Wilson et al. | 330/278 |

*Primary Examiner*—Reinhard J. Eisenzopf
*Assistant Examiner*—Andrew Faile

[57] ABSTRACT

A signal transmission device having ALC function includes a detection circuit for output level detection when used in a multi-carrier system where the number of carriers changes. The signal transmission device further has a variable attenuator for controlling a level of a transmission signal. A transmission circuit is coupled to the output of the variable attenuator for modulating a local oscillation signal with the output of the variable attenuator and for generating a modulated output signal. The detection circuit is provided with the modulated output signal for generating a detection voltage. The detection circuit includes a diode having a square-law characteristic region. A reference voltage generating circuit receives an information signal indicative of the number of carriers for generating a reference voltage corresponding to the number of carriers. A first control circuit is provided, receiving the detecting voltage and the reference voltage, for generating and supplying, to the variable attenuator, a first control signal of a difference between the detection voltage and the reference voltage. A second control circuit is supplied with the information signal indicative of the number of carriers, for generating and supplying, to the detection circuit, a second control signal corresponding to the number of carriers, whereby the square-law characteristic region of the diode in the detection circuit is shifted responding to the second control signal.

18 Claims, 15 Drawing Sheets

FIG. 6
TRANSMISSION CIRCUIT
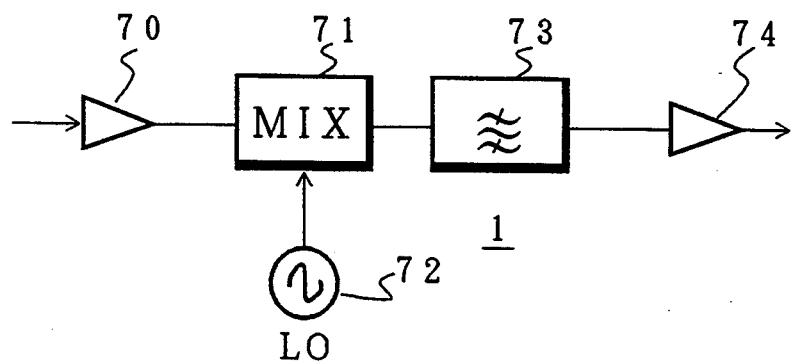
FIG. 10    CONTROL CIRCUIT
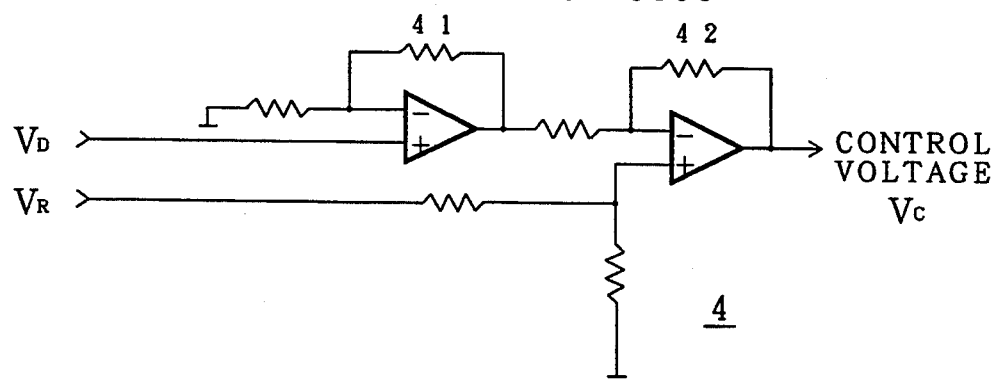

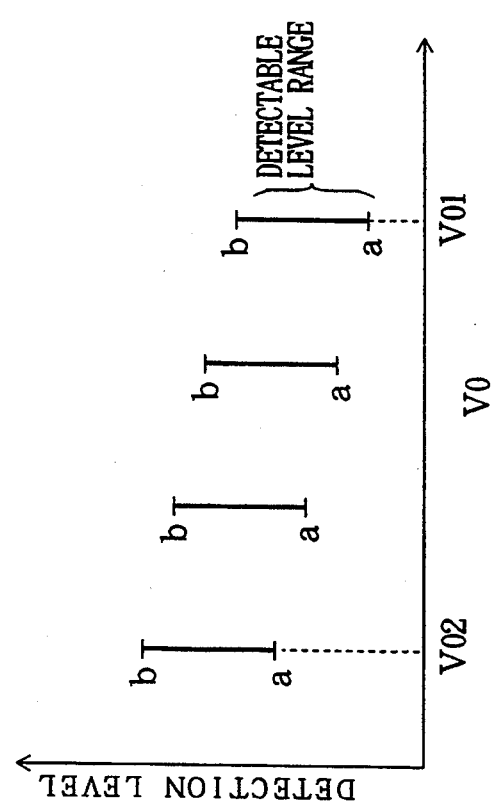

SIGNAL TRANSMISSION DEVICE HAVING AN AUTOMATIC TRANSMISSION LEVEL CONTROL CIRCUIT USED IN A MULTI-CARRIER TRANSMISSION TERMINAL EQUIPMENT AND MULTI-CARRIER TRANSMISSION TERMINAL EQUIPMENT EMPLOYING THE TRANSMISSION DEVICE

BACKGROUND OF THE INVENTION

1. Field of the Invention

The present invention relates to a signal transmission device having ALC (.Automatic transmission Level Control) function and also to transmission terminal equipment having the signal transmission device. More particularly, the present invention relates to a signal transmission device having ALC function effective in a system where the number of carriers changes in bursts by, for example, DAMA (demand-assignment activation), voice activation, etc. in a radio satellite communication system. The present invention also relates to multi-carrier transmission terminal equipment having the signal transmission device.

2. Related Prior Art

In an SCPC (Single Channel Per Carrier) system used in radio satellite communication or subscriber radio communication, for example, in the case of a DAMA system, a carrier is sent out after a communication channel (i.e., carrier frequency) has been assigned from the master station in response to a request from a slave station. In the case of a voice activation (or carrier on/off) system, a carrier is sent out as long as a speech input is present.

In such a system, since the number of carriers sent out changes with time, the total power, which is the target of ALC, also changes with time. Accordingly, the system is required to have a dynamic; range sufficiently wide to cover the range in which the number of carriers may change for detection of the output level.

FIG. 1 shows one example of the arrangement of a conventional signal transmission device having ALC. The illustrated arrangement is disclosed in the invention of U.S. patent application Ser. No. 851,614, made by the inventors of this application.

Referring to FIG. 1, a transmission circuit 1 includes a frequency converter for converting an intermediate-frequency (IF) signal into a radio-frequency (RF) signal, a high-power amplifier, etc., The transmission circuit 1 modulates a carrier from a local oscillator in accordance with an intermediate-frequency (IF) signal and amplifies the modulated carrier to generate a transmission output. The transmission output is sent to an antenna through a hybrid circuit 7.

A detection circuit 2 detects the level of the transmission output distributed from the hybrid circuit 7 and outputs a detection signal VD of direct-current (DC) voltage corresponding to the detected level.

A reference voltage generating circuit 3 generates a reference voltage VR the size of which changes according to information showing the number of carriers. The information showing the number of carriers is obtained from a control device (described later). Alternatively, the information may be produced from the signal transmission device itself as is disclosed in the aforementioned U.S. patent application Ser. No. 851,614.

A control circuit 4 detects a difference voltage between the reference voltage VR and the detection voltage VD and inputs a control signal VC to a variable attenuator circuit 5 (described later) so that the difference voltage converges to zero.

The variable attenuator circuit 5 controls the gain of the input signal on the basis of the control signal VC corresponding to the difference voltage, sent from the control circuit 4, to generate a modulating signal for the transmission circuit 1.

Thus, in the arrangement shown in FIG. 1, the detection circuit 2 generates a detection voltage VD which changes with the number of carriers. In the meantime, the reference voltage generating circuit 3 changes the setting of the reference voltage VR, which is the control target, according to the information showing the number of carriers. The control circuit 4 compares the detection voltage VD with the reference voltage VR and controls the gain of the variable attenuator circuit 5 on the basis of the result of the comparison, thereby maintaining the transmission output per carrier at a proper value.

When the number of carriers changes in the above-described signal transmission device, the dynamic range in the detection circuit 2 becomes a matter of great concern. What the detection circuit 2 observes is the total output signal level. Therefore, the proper transmission level for the transmission of 1 carrier differs from that for the transmission of 6 carriers by $$10 \log(6/1) = 7.78 \text{ dB}$$

That is, for the same power per carrier, the total power for 6 carrier's is higher than that for 1 carrier by 7.78 dB.

In general, the detection circuit 2 comprises a detector using a diode. However, the range of diode's square-law characteristic usable for measurement of power is limited. Accordingly, there are upper and lower limits on the detectable level range, which determines the dynamic range of the detection circuit 2.

In the present state of art, the dynamic range is 15 dB at the most.

On the other hand, it is not rare that the range of level variation necessary to compensate for by ALC in the system exceeds 10 dB when all level variation factors to be compensated are taken into consideration, i.e., variation of the gain of the transmission circuit 1 with temperature, variation of the cable length, variation of each component, and so forth.

FIG. 2 shows one example of distribution of the dynamic range of the detection circuit 2. If the range of level variation factors to be compensated by ALC is assumed to be 10 dB, the range of level variation by 6 carriers is 7.78 dB. Accordingly, if the dynamic range of the detection circuit 2 in the system is 15 dB, the variation range lacks about 3 dB.

In such a case, level compensation may be made for each component in order to compress the level variation factors to be compensated. Alternatively, ALC may be divided into two stages to make compensation at each stage.

FIG. 3 shows one example of a signal transmission device having ALC composed of two stages. In the figure, a pair of transmission circuits 1a and 1b, a pair of detection circuits 2a and 2b, a pair of reference voltage generating circuits 3a and 3b, a pair of control circuits 4a and 4b, and a pair of variable attenuator circuits 5a and 5b respectively correspond to the transmission circuit 1, the detection circuit 2, the reference voltage generating circuit 3, the control circuit 4, and the variable attenuator circuit 5, which are shown in FIG. 1.

In the arrangement shown in FIG. 3, the transmission circuit in the signal transmission device is divided into two stages, i.e., the transmission circuits 1a and 1b, to effect amplification and other required operation, and the detection circuits 2a and 2b are provided to correspond to the two transmission circuits, respectively, for detection of output levels. Subsequently, the detected output levels are compared with respective reference voltages supplied from the reference voltage generating circuits 3a and 3b in the control circuits 4a and 4b to obtain difference voltages, and the gain is controlled in the variable attenuator circuits 5a and 5b on the basis of the difference voltages, thereby effecting ALC.

Accordingly, the signal transmission device shown in FIG. 3 has a dynamic range equal to the sum of the respective dynamic ranges of the detection circuits 2a and 2b and is therefore capable of realizing the desired ALC.

However, either of the conventional methods, in which level compensation is made for each component, or the signal transmission device is composed of two stages, suffers from the problem that the hardware scale increases and the system cost rises unavoidably.

SUMMARY OF THE INVENTION

Accordingly, it is an object of the present invention to provide a signal transmission device having ALC function, which is capable of enlarging the dynamic range of a detection circuit for output level detection when used in a multi-carrier system where the number of carriers changes, and which is simple in arrangement and less costly.

It is another object of the present invention to enlarge the dynamic range for output level detection by shifting the square-law characteristic region of a diode constituting an output level detection circuit on the basis of a control signal generated from information showing the number of carriers.

It is still another object of the present invention to generate a reference voltage corresponding to information showing the number of carriers and to control the gain of the output level so that there is no difference between the reference voltage and the detection output of an output level detection circuit.

It is a still further object of the present invention to provide a signal transmission device having an automatic transmission level control circuit used in a multi-carrier communication system, comprising: a variable attenuator for controlling a level of a transmission signal; a transmission circuit coupled to the output of the variable attenuator for modulating a local oscillation signal with the output of the variable attenuator and for generating a modulated output signal; a detection circuit provided with the modulated output signal for detecting a level of the modulated output signal and for generating a detection voltage, the detection circuit including a diode having a square-law characteristic portion; a reference voltage generating circuit for receiving an information signal showing number of carriers for generating a reference voltage corresponding to the number of carriers; a first control circuit provided with the detection voltage and the reference voltage for generating and supplying to the variable attenuator a first control signal of a difference between the detection voltage and the reference voltage; and a second control circuit provided with the information signal showing the number of carriers for generating and supplying to the detection circuit a second control signal corresponding to the number of carriers, whereby the square-law characteristic region of the diode in the detection circuit is shifted responding to the second control signal.

Other objects and advantages of the present invention will become apparent from the detailed description to follow taken in conjunction with the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a block diagram of a transmission circuit 1 in the signal transmission device shown in FIG. 5.

FIG. 10 is a block diagram of a control circuit 4 in the signal transmission device shown in FIG. 5.

FIG. 12 is a graph showing the relationship between the control voltage Vo and the detection level.

DETAILED DESCRIPTION OF THE PREFERRED EMBODIMENTS

Figure 4:
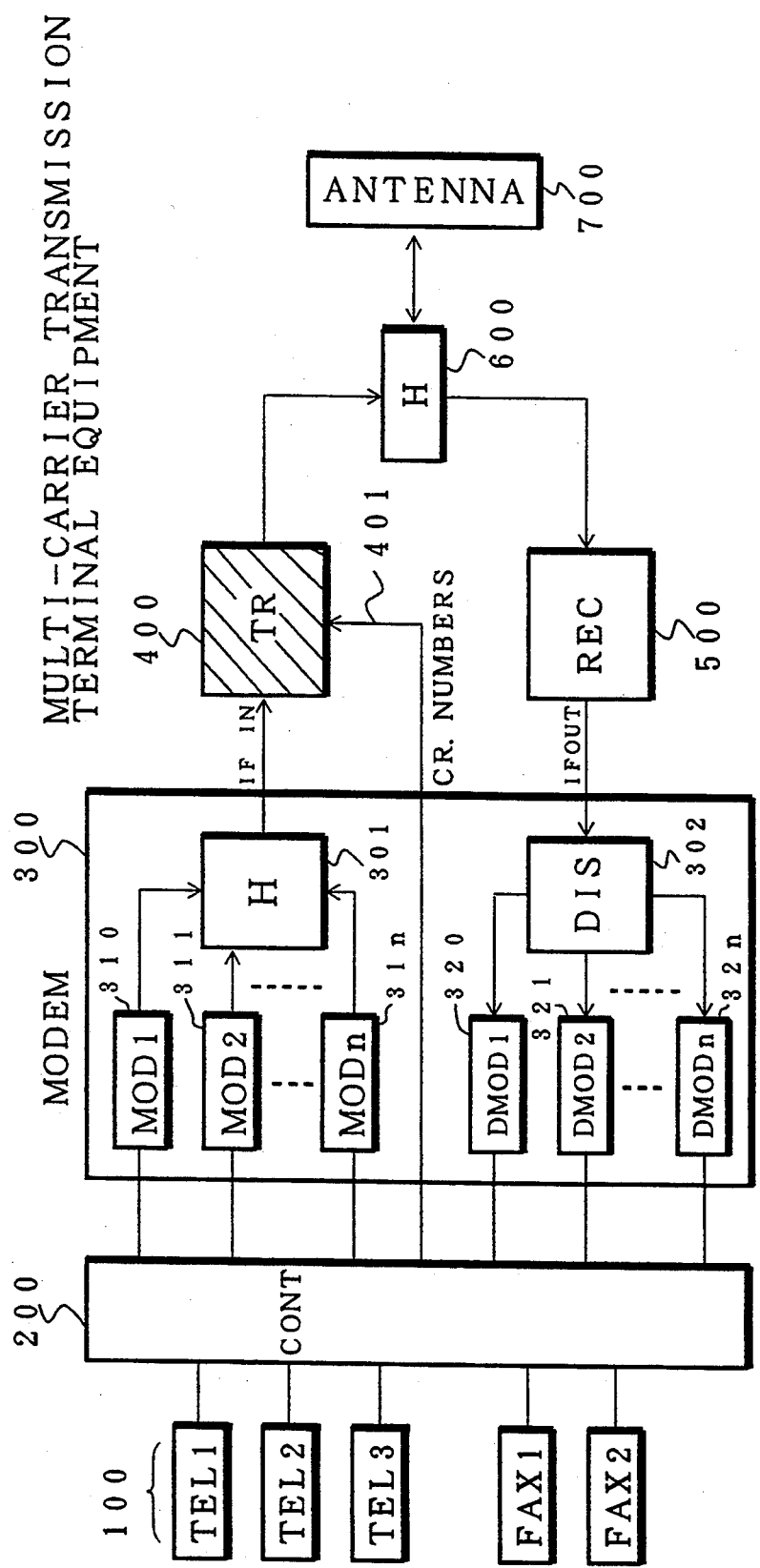
FIG. 4 is a block diagram showing the arrangement of multi-carrier transmission terminal equipment employing the signal transmission device of the present invention.

FIG. 4 is a block diagram showing one embodiment of multi-carrier transmission terminal equipment in a satellite communication system, which includes a signal transmission device having an automatic transmission level control circuit according to the present invention. In the figure, reference numeral 100 denotes a plurality of signal sources. In this embodiment, telephone terminals TEL1 to TEL3 and facsimile terminals FAX1 and FAX2 are shown as examples of signal sources 100.

A connection controller 200 connects the telephone terminals TEL1 to TEL3 and the facsimile terminals FAX1 and FAX2 to a modem (modulator-demodulator) 300 under control. The multi-carrier transmission terminal equipment further includes a modem 300, a signal transmission device 400, a signal reception device 500, a hybrid circuit 600, and an antenna 700.

The modem 300 has a plurality of modulators 310 to 31n on the transmission side. Each modulator is connected with the telephone terminals TEL1 to TEL3 and the facsimile terminals FAX1 and FAX2 under the control of the connection controller 200. In addition, master station equipment (not shown) informs the connection controller 200 of assignment of one carrier to each of the modulators 310 to 31n.

The modulators; 310 to 31n are each supplied with the assigned carrier. Each modulator modulates this carrier in accordance with a signal from a terminal 100 connected thereto and inputs the modulated carrier to a hybrid circuit 301. Accordingly, the modem 300 is provided with a synthesizer for supplying the assigned carriers to the respective modulators 310 to 31n.

On the reception side of the modem 300, an intermediate-frequency (IF) signal output from the signal reception device 500 is input to a distributor 302. The distributor 302 distributes the input signal to a plurality of demodulators 320 to 32n. Each of the demodulators 320 to 32n demodulates the input signal and outputs the demodulated signal to the corresponding terminal 100 through the connection controller 200.

The signal transmission device 400 has an automatic transmission level control circuit, which characterizes the present invention. The signal transmission device 400 controls the gain of the transmission level of the modulated IF signal from the modem 300, convert it into a radio-frequency signal, amplifies it, and transmits the resulting high-output signal.

The signal transmission device 400 further receives information showing the number of carriers from the connection controller 200, for example, and adjusts the transmission power level according to the number of carriers, as described later.

The hybrid circuit 600 leads the amplified signal from the signal transmission device 400 to the antenna 700 and also leads the signal received from the antenna 700 to the signal reception device 500.

Figure 5:
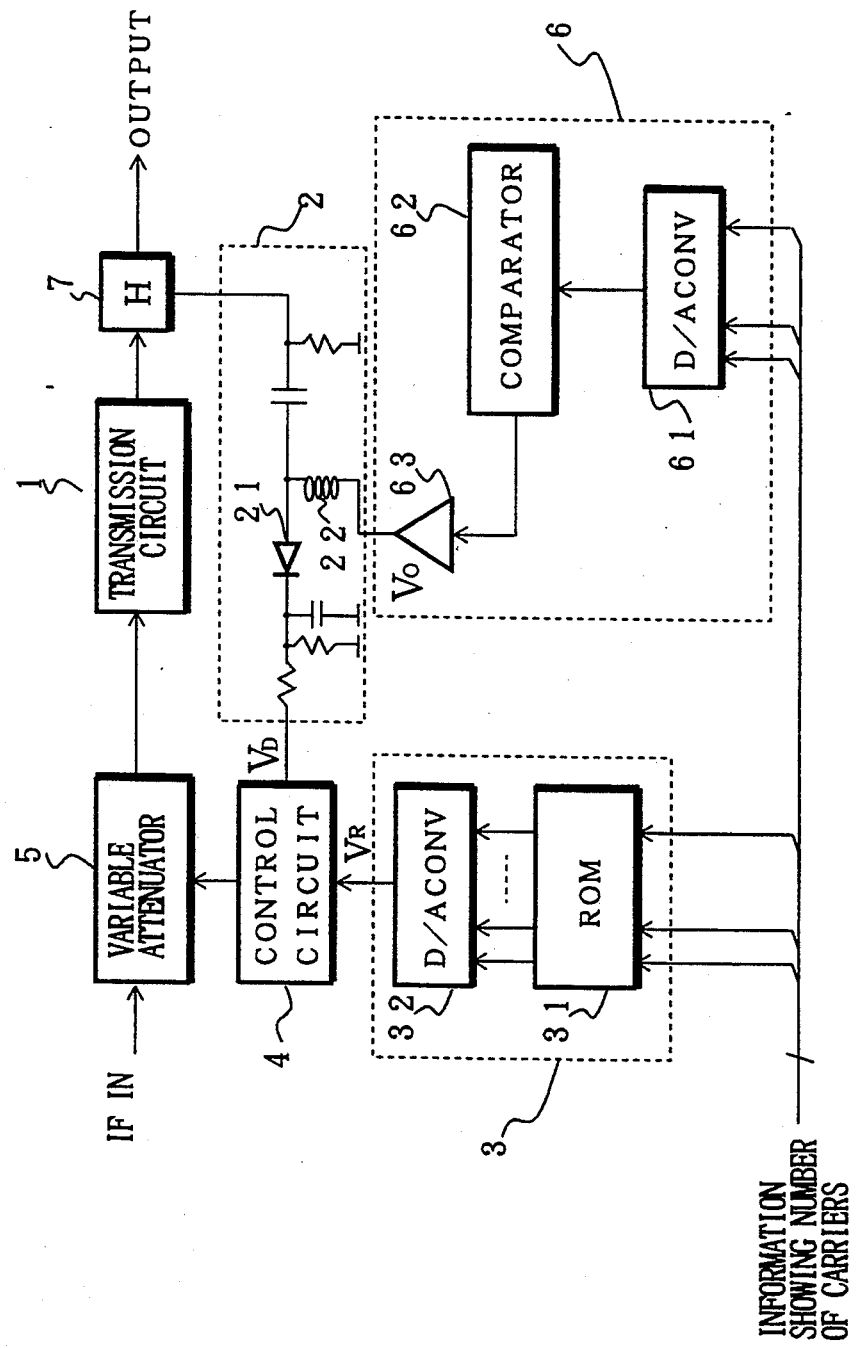
FIG. 5 is a block diagram showing a first embodiment of the signal transmission device according to the present invention.

FIG. 5 is a block diagram showing a first embodiment of the signal transmission device 400 in the multi-carrier transmission terminal equipment (shown in FIG. 4), which has an automatic transmission level control circuit featuring the present invention.

It should be noted that in the accompanying drawings the same or similar elements are denoted by the same reference numerals and symbols.

Figure 1:
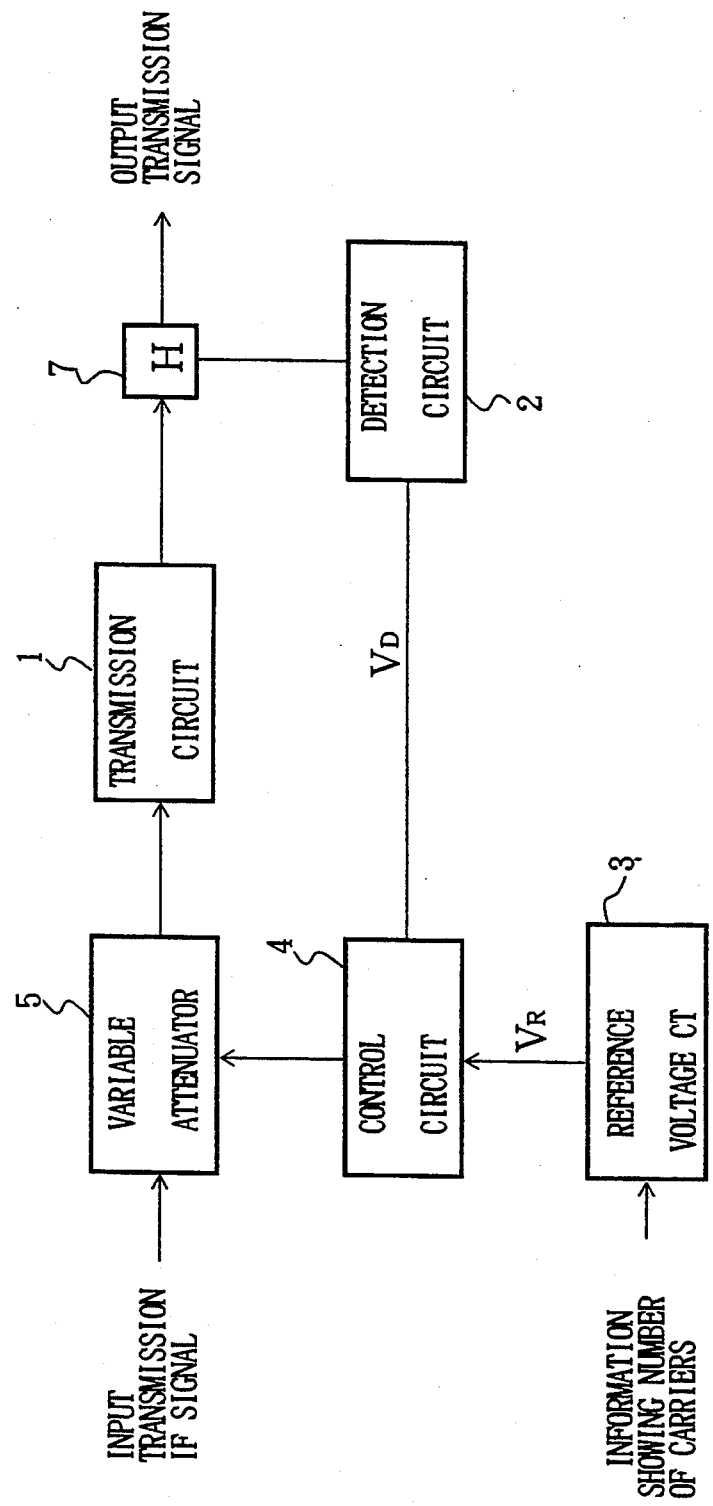
FIG. 1 is a block diagram showing one example of a conventional signal transmission device.
Figure 2:
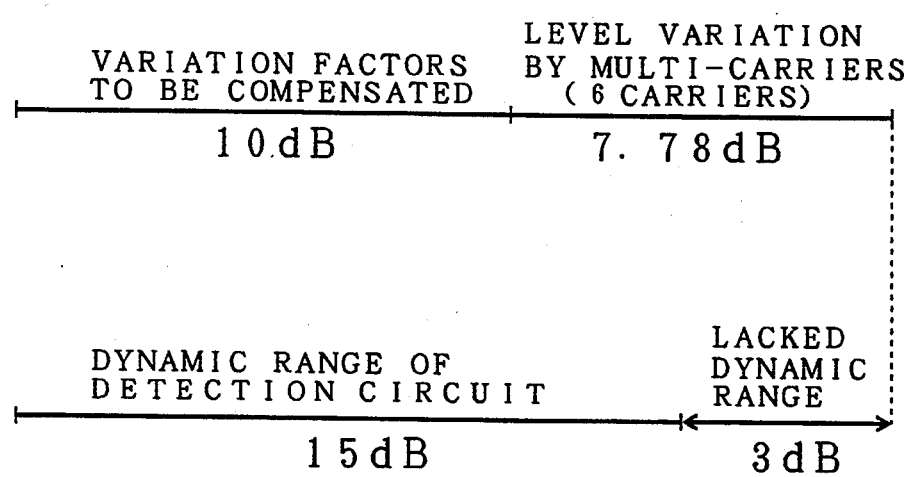
FIG. 2 illustrates one example of distribution of the dynamic range of a detection circuit in the conventional signal transmission device.
Figure 3:
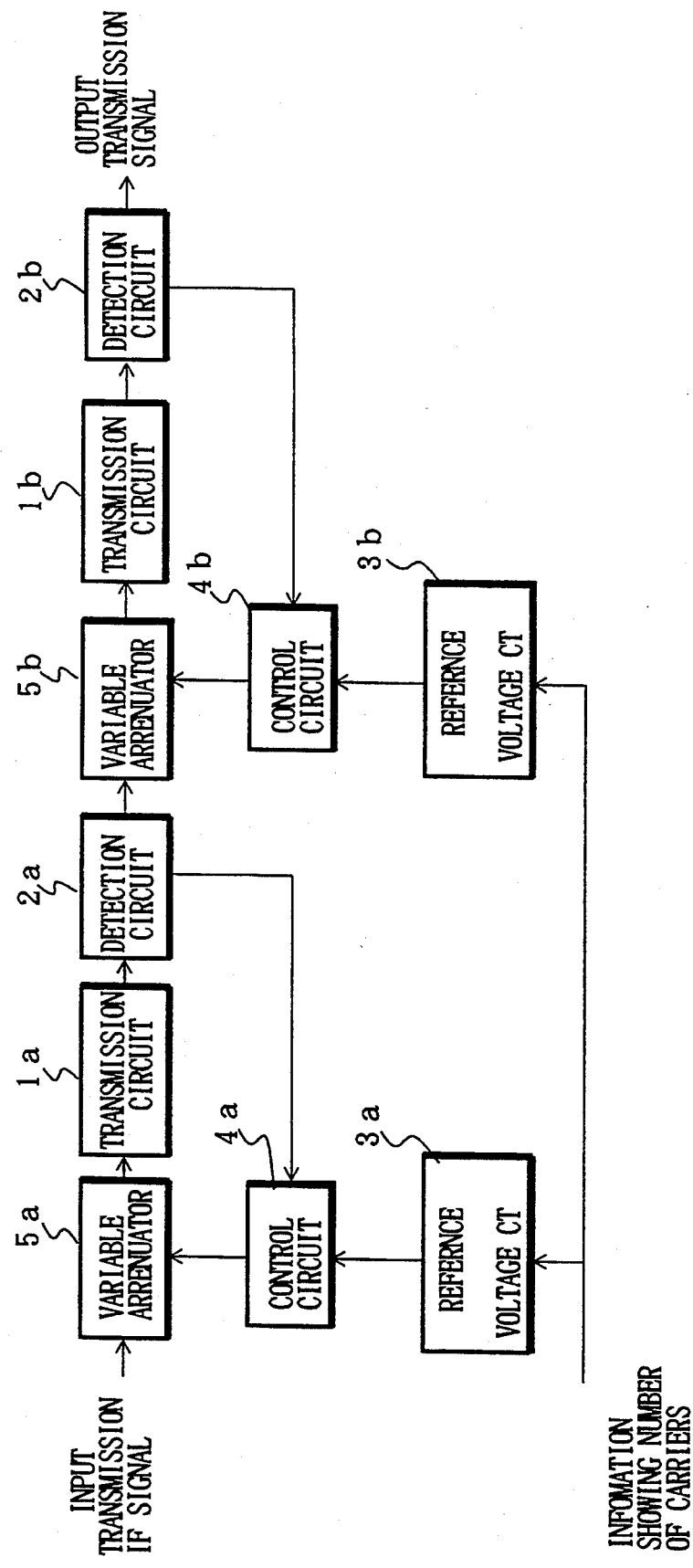
FIG. 3 is a block diagram showing a second example of a conventional signal transmission device.

In FIG. 5, the functions of circuits shown by blocks 1, 3, 4, 5 and 7 are basically the same as those of the circuits shown by the blocks that are denoted by the corresponding reference numerals in FIG. 1.

The following is a description of specific examples of these circuits, together with a circuit added by the present invention and an arrangement characteristic of it.

A transmission circuit 1 includes a frequency converter for converting an intermediate-frequency (IF) signal into a radio-frequency (RF) signal, a high-power amplifier, etc. The transmission circuit 1 excites a carrier from a local oscillator by an excitation signal to generate a transmission output. A specific example of the transmission circuit 1 is shown in FIG. 6.

Referring to FIG. 6, an amplifier 70 amplifies an output from a variable attenuator 5 (described later). A mixer 71 modulates a radio-frequency carrier from a local oscillator 72 in accordance with the signal amplified by the amplifier 70, thereby effecting frequency conversion.

A band-pass filter 73 has the frequency of the above-described radio-frequency carrier as a center frequency. The output of the band-pass filter 73 is led to a high-power amplifier 74 where it is power-amplified. The amplified output is transmitted through the antenna 700 via the hybrid circuit 7.

A detection circuit 2 has a diode 21 and a high-frequency blocking coil 22 that supplies a bias current to the diode 21. The detection circuit 2 detects the level of the output signal distributed from the hybrid circuit 7 and outputs a detection output Vd. The detection is effected by making use of the square-law characteristic of the diode 21.

Figure 7:
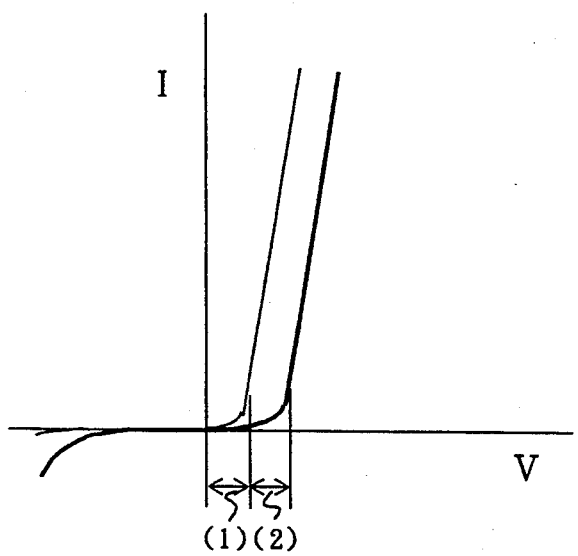
FIG. 7 is a graph showing the square-law characteristic of a detection circuit 2 in the signal transmission device shown in FIG. 5.

Incidentally, the square-law characteristic of the diode 21 is available within a narrow range at the lower part of a straight-line region in the graph of FIG. 7, which shows the relationship between the detection input voltage (the level of the output signal distributed from the hybrid circuit 7) and detection output current of the diode.

Accordingly, the characteristic feature of the present invention resides in realization of enlargement of the dynamic range that is determined by such a narrow range.

For this purpose, one embodiment of the present invention is arranged to control the size of a control voltage Vo (i.e., the output of a control circuit 6 for the detection circuit 2, described later), which is used to supply the bias current to the diode 21 through the high-frequency blocking coil 22, so as to shift the square-law characteristic region of the diode 21, thereby substantially enlarging the dynastic range for the level detection.

FIG. 7 shows the relationship between the detection input voltage and detection output current of the diode. The detection input voltage V (V2 is proportional to the output level) and the detection output current I show square-law characteristic within a certain range. However, this range can be shifted in accordance with the size of the control voltage Vo as will be understood from FIG. 7, in which (1) shows the square-law characteristic range available when the control voltage Vo=-Vo1, and (2) shows the square-law characteristic range available when the control voltage Vo=Vo2. Thus, the detectable level range is substantially enlarged.

In this way, the dynamic range of the diode 21 within which the output signal level can be detected is substantially enlarged.

It should be noted that the detection output current I from the diode 21 is converted into an equivalent voltage value by a parallel resistance provided subsequently to the diode 21 in the detection circuit 2, and the voltage value is output as a level detection voltage VD.

The above-described relationship will be explained again later in connection with the detection circuit control circuit 6.

A reference voltage generating circuit 3 generates a reference voltage VR whose size changes according to information showing the number of carriers. In this embodiment, the reference voltage generating circuit 3 includes a read-only memory (ROM) 31 and a D/A converter 32.

The information showing the number of carriers is sent from the connection controller 200, as has been described in connection with FIG. 4. Alternatively, it may be generated from the signal transmission device itself, as is disclosed in the aforementioned U.S. patent application Ser. No. 851,614.

The information showing the number of carries is given as N-bit parallel data. The number of bits is determined as follows: If the system concerned uses 6 carriers, for example, the parallel data is composed of 3 bits. Digital values which are determined by the value of number of carriers and the value of control voltage Vo used to control the detection circuit 2 are stored in the ROM 31, and the digital values are read out by N-bit parallel data.

A readout digital value is converted into an analog voltage by the D/A converter 32 and supplied as a reference voltage VR to the control circuit 4.

Figure 8:
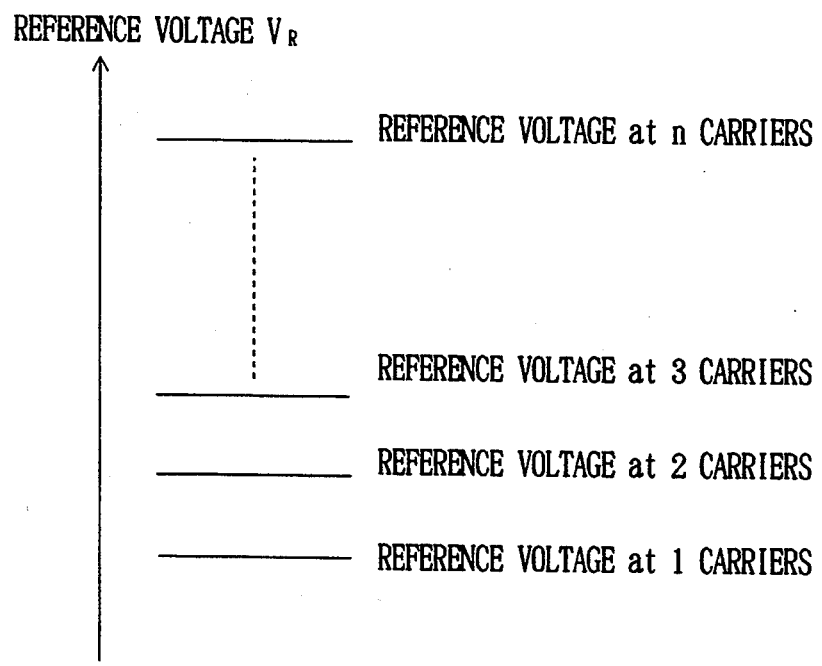
FIG. 8 is a graph showing the setting of reference voltage VR.

The N-bit parallel data, which is information showing the number of carriers, and the reference voltage VR are related to each other such that as the number of carriers increases, the reference voltage VR increases, as shown in FIG. 8.

Figure 9:
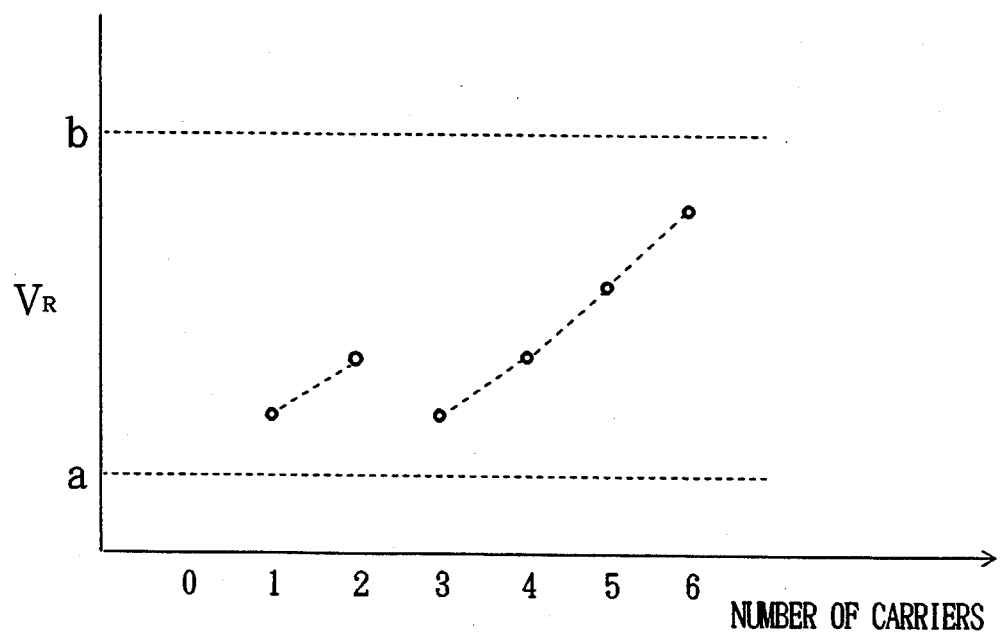
FIG. 9 is a graph showing the relationship between the number of carriers and the reference voltage VR.

The relationship between the number of carriers and the reference voltage will be understood more specifically from FIG. 9. That is, for the detectable level range a-b in the detection circuit 2, two different kinds of reference voltage VR that change with the number of carriers are generated with regard to two different cases, i.e., one where the number of carriers is 1 or 2, and the other where the number of carriers is from 3 to 6.

A control circuit 4 detects a difference voltage between the reference voltage VR from the reference voltage generating circuit 3 and the detection voltage VD from the detection circuit 2 and outputs the control voltage VC so that the difference voltage converges to zero. A specific example of the control circuit 4 is shown in FIG. 10.

That is, operational amplifiers 41 and 42 are cascaded so that the operational amplifier 41 outputs the control voltage VC as a difference between the detection voltage VD and the reference voltage VR.

Figure 11:
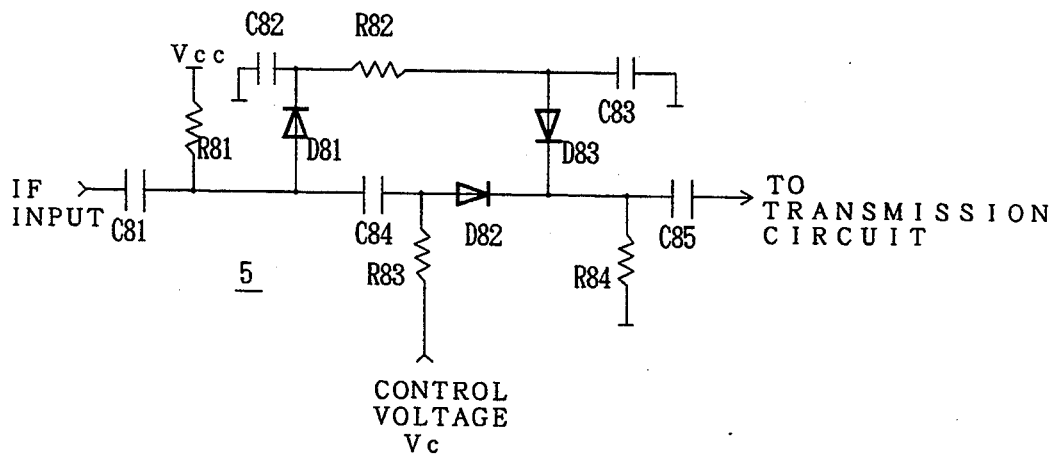
FIG. 11 is a block diagram of a variable attenuator circuit 5 in the signal transmission device shown in FIG. 5.

A variable attenuator circuit 5 controls the gain of an IF signal input thereto so that the gain is at a predetermined level, and delivers the output to the transmission circuit 1. A specific arrangement of the variable attenuator circuit 5 is shown in FIG. 11.

That is, the variable attenuator circuit 5 is arranged in the form of a pi attenuator that is composed of resistors R81 to R84, capacitors C81 to C85, and PIN diodes D81 to D83. The PIN diodes D81 to D83 are diodes whose resistance changes with the current flowing therethrough.

Accordingly, the resistances of the PIN diodes D81 to D83 are controlled by the control voltage VC applied through the resistor R83, thereby controlling the overall gain of the $\pi$ attenuator. As a result, the IF signal supplied to the input terminal is subjected to predetermined attenuation and led to the transmission circuit 1 such that the transmission output; per carrier is maintained at a proper value.

Reference numeral 6 in FIG. 5 denotes a control circuit newly added by the present invention, which controls the detection circuit 2, that is, outputs a control voltage Vo used to supply a bias current to the diode 21 through the high-frequency blocking coil 22.

In the embodiment shown in FIG. 5, the control circuit 6 includes a D/A converter 61, a comparator 62, and an amplifier 63. The above-described N-bit parallel data, which is information showing the number of carriers, is input to the reference voltage generating circuit 3 and also input to the D/A converter 61 in the control circuit 6.

The N-bit parallel data is converted into an analog signal of the corresponding size by the D/A converter 61. The analog signal is compared with a predetermined value in the comparator 62. The result of the comparison is output as a control voltage Vo through the amplifier 63.

The predetermined value set in the comparator 62 to determine the size of the control voltage Vo is determined from the following viewpoint.

FIG. 12 shows the relationship between the control voltage Vo and the range of detection made in the detection circuit 2 for the level of the output signal from the hybrid circuit 7. It will be understood from the figure that even if the detectable level range a-b in the detection circuit 2, that is, the square-law characteristic region of the diode 21, is the same, a change in the size of the control voltage Vo from the detection circuit control circuit 6 causes the detection level range to shift as a whole.

Figure 13:
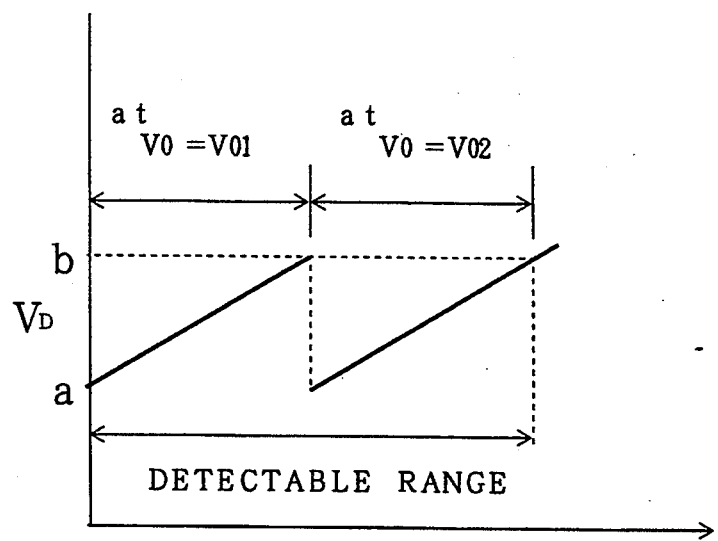
FIG. 13 is a graph showing detection voltage characteristics in an arrangement where the control voltage Vo and the detection level range are each changed over between two levels.

FIG. 13 is an illustration of the relationship between the number of carriers and the setting of the control voltage Vo, showing detection voltage characteristics in a case where the control voltage is changed over between two levels.

It will be clear from FIG. 13 that the detection voltage VD, which is the output of the detection circuit 2 with respect to the: output signal level, changes in two different steps where the control voltage Vo=Vo1 and Vo=Vo2, respectively, and thus the detectable level range enlarges.

In this case, the comparator 62 makes comparison between a predetermined value and the output of the D/A converter 61. If the output of the D/A converter 61 is larger than the predetermined value, the control voltage Vo is set to Vo1, whereas, if the former is smaller than the latter, Vo is set to Vo2.

Figure 14:
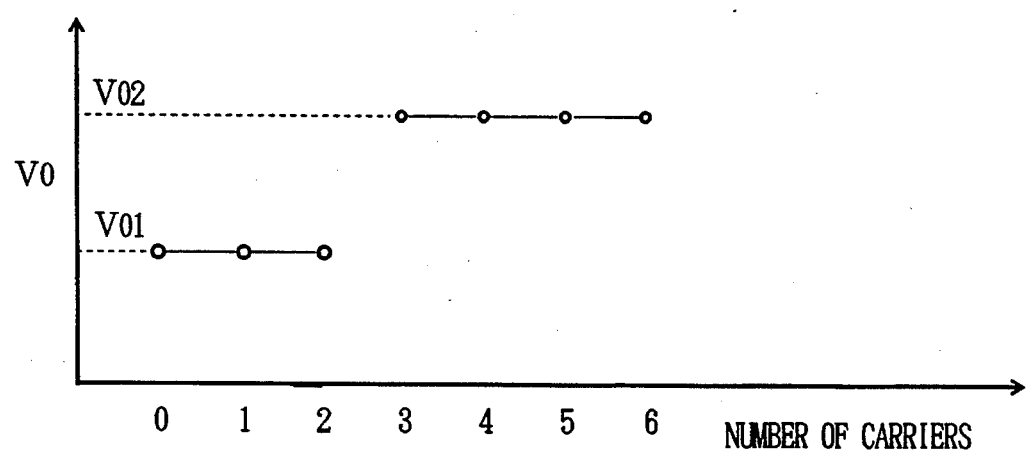
FIG. 14 is a graph showing one example of setting of the control voltage Vo with respect to the number of carriers.

FIG. 14 shows an arrangement in which the value of the control voltage Vo is set to Vo1 for the range of numbers of carriers from 0 to 2 and to Vo2 for the range of numbers of carriers from 3 to 6. In this case, the comparator 62 is given as a predetermined value for comparison a size intermediate between two outputs from the D/A converter 61 which correspond to two cases where the numbers of carriers are 2 and 3, respectively.

When the control voltage Vo is changed between two levels Vo1 and Vo2 as described above, the characteristics of the diode 21 are shifted as shown at (1) and (2) in FIG. 7 in the relationship between the detection input voltage and detection output current of the diode, shown in the figure, and the square-law characteristic range is enlarged.

Thus, the dynamic range for the level detection in the detection circuit 2 can be enlarged.

Figure 15:
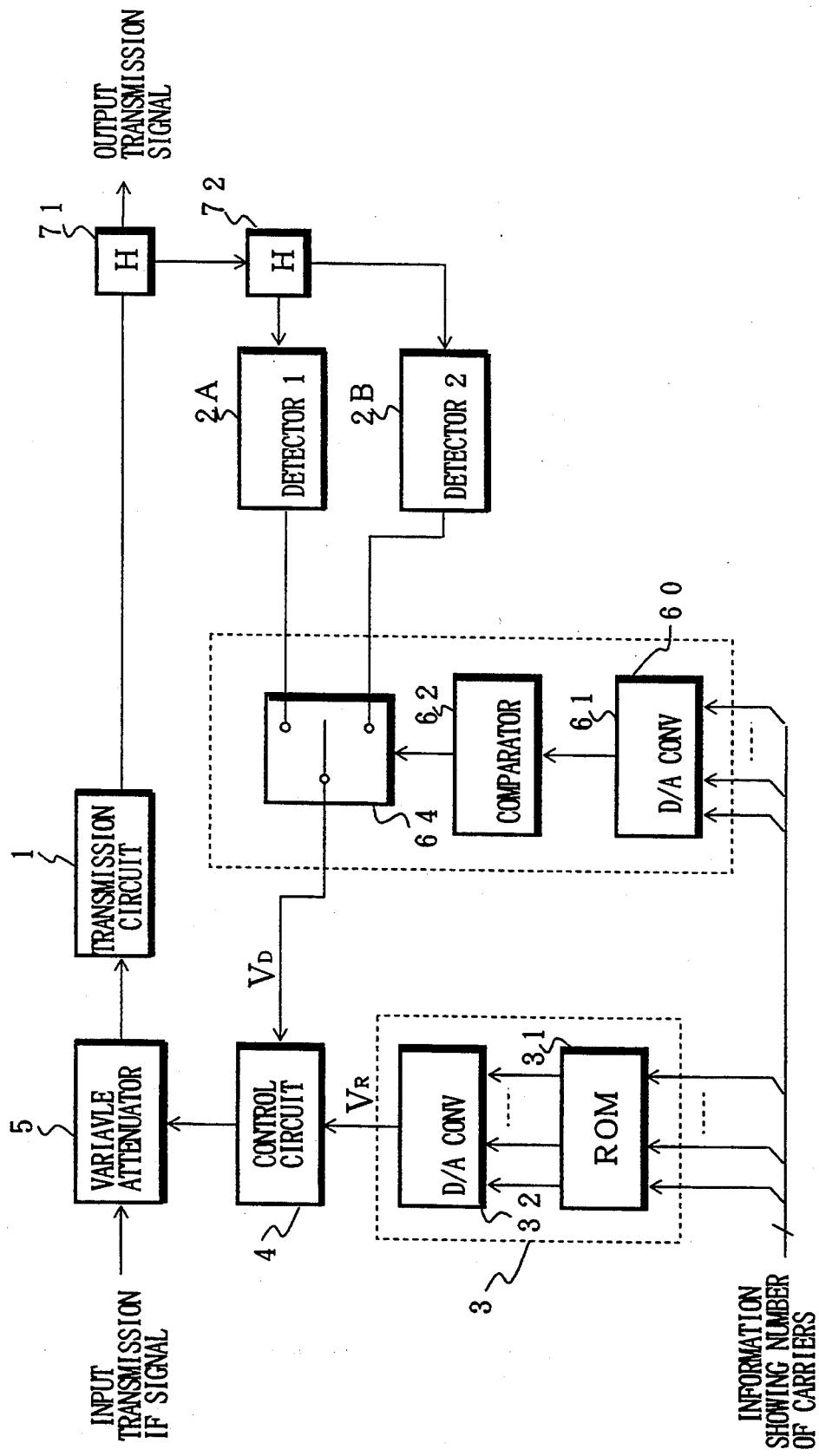
FIG. 15 is a block diagram showing a second embodiment of the signal transmission device according to the present invention.

FIG. 15 is a block diagram showing a second embodiment of the present invention. The same elements as those in FIG. 5, which shows the first embodiment, are denoted by the same reference numerals and symbols.

The arrangement is almost similar to that of the first embodiment, shown in FIG. 5. The second embodiment has two hybrid circuits 71 and 72 so that the output signal distributed from the hybrid circuit 71 is subdivided into two by the hybrid circuit 72.

The second embodiment further has two detection circuits, that is, a first detection circuit 2A and a second detection circuit 2B. These two detection circuits 2A and 2B are respectively fed with the subdivided output signals from the hybrid circuit 72.

Furthermore, the two detection circuits 2A and 2B have different detection level ranges with respect to the same transmission output, level that is input to these circuits 2A and 2B, and generate detection voltages VD1 and VD2 corresponding to the respective detection levels. Therefore, the detection circuits 2A and 2B are basically similar in arrangement to the detection circuit 2 shown in FIG. 5 but different; therefrom in the following point.

The detection circuits 2A and 2B are arranged so as to have different detection level ranges by applying different fixed bias voltages to the high-frequency blocking coil 22 in the detection circuit 2 shown in FIG. 5. For example, the detection circuits 2A and 2B may be connected to fixed voltage sources respectively corresponding to Vo1 and Vo2.

Figure 16:
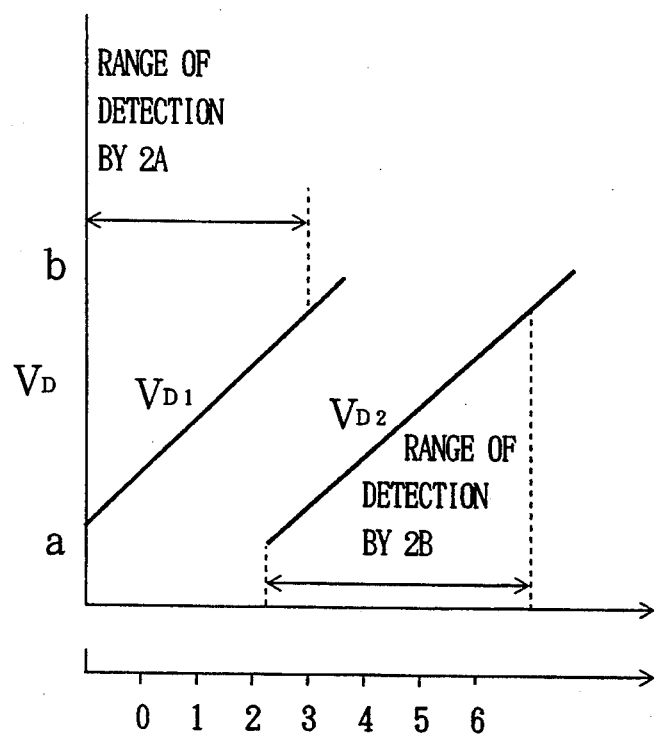
FIG. 16 is a graph showing the operation of detection circuits 2A and 2B in the signal transmission device shown in FIG. 15.

FIG. 16 illustrates the operation of the detection circuits 2A and 2B. As shown in the figure, for the detectable level range a-b, the detection circuit 2A generates a detection voltage VD1 in a range corresponding to the range of numbers of carriers from 1 to 2, while the detection circuit 2B generates a detection voltage VD2 in a range corresponding to the range of numbers of carriers from 3 to 6.

Referring back to FIG. 15, a control circuit 60 for the detection circuit output selects either of the detection signals from the detection circuits 2A and 2B according to the information showing the number of carriers and sends the selected detected signal to the control circuit 4.

The detection circuit output control circuit 60 has a D/A converter 61 and a comparator 62, which are similar to the D/A converter 61 and the comparator 62 in the detection circuit control circuit 6 in the embodiment shown in FIG. 5.

The information showing the number of carriers, which is parallel data, is converted into an analog voltage in the D/A converter 61 and then input to the comparator 62. The comparator 62 sends an analog switch 64 a binary signal which assumes either of "H" and "L" states according to whether the input voltage from the D/A converter 61 is not higher than a predetermined value corresponding to a certain number of carriers or it is a predetermined value corresponding to a number of carriers higher than the certain number.

The analog switch 64 selects either of the detection circuits 2A and 2B according to the binary signal and sends the control circuit 4 the detection output VD1 or VD2 of the selected detection circuit as a detection signal VD. In the case of FIG. 16, when the number of carriers is in the range of from 1 to 2, the detection voltage VD1 is selected, whereas, when the number of carriers is in the range of from 3 to 6, the detection voltage VD2 is selected. Then, the selected detection voltage: VD1 or VD2 is sent to the control circuit 4.

Figure 17:
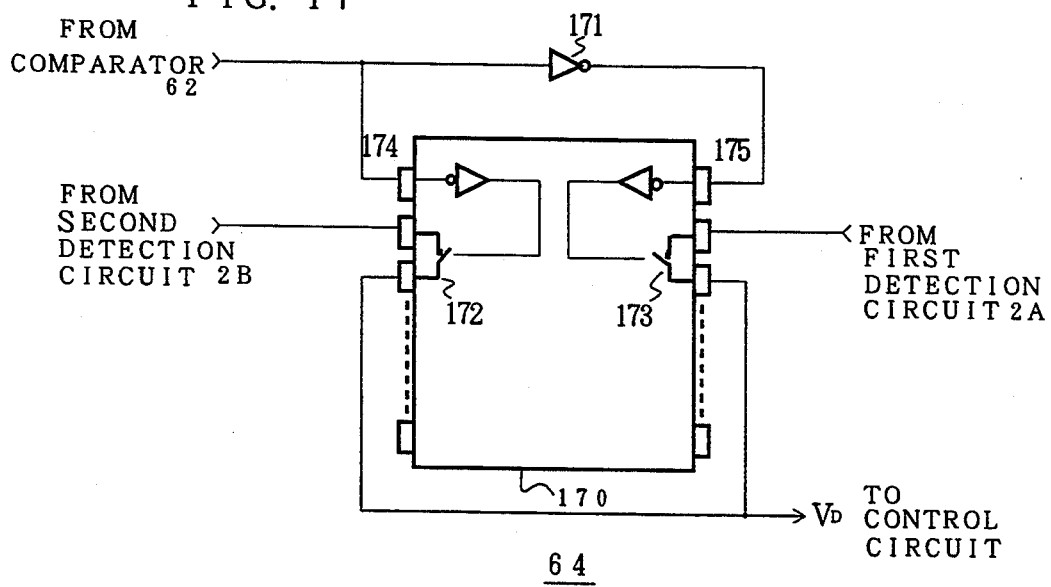
FIG. 17 is a block diagram showing one example of the arrangement of a change-over switch 64 in the signal transmission device shown in FIG. 15.

The switching operation for selecting either one of the detection signals from the detection circuits 2A and 2B is carried out by the switch 64. The switch 64 can be arranged by using, for example, a semiconductor element (MB47201, manufactured by Fujitsu Limited.) 170 as shown in FIG. 17. FIG. 17 illustrates a part of the switch 64 that uses a pair of switching circuits 172 and 173. One end of each of the switching circuits 172 and 173 is fed with the output of the corresponding detection circuit 2A or 2B. The other ends of the switching circuits 172 and 173 are connected in common to the control circuit 4.

In the meantime, a control signal supplied from the comparator 62 to control the switching operation of the switching circuits 172 and 173 is input directly to a terminal 174 and also input to another terminal 175 through an inverter 171. Accordingly, either of the switching circuits 172 and 173 is closed according to whether the control signal from the comparator 62 is "1" or "0". Thus, the detection voltage VD1 or VD2 from the corresponding detection circuit 2A or 2B is selected and input to the control circuit 4 as a detection output YD.

Although in the second embodiment two detection circuits are used, it should be noted that the present invention is not necessarily limited thereto and that three or more detection circuits may be changed over from one to another, as a matter of course, by arranging the comparator 62 in the form of a window.

As has been described above, the present invention enables the dynamic range for the level detection to be enlarged to adjust to the change in the number of transmission carriers and hence makes it possible to widen the applicable range of ALC.

The invention may be embodied in other specific forms without departing from the spirit or essential characteristics thereof.

The present embodiment is therefore to be considered in all respects as illustrative and not restrictive, the scope of the invention being indicated by the appended claims rather than by the foregoing description and all changes, which come within the meaning and range of equivalency of the claims therefore intended to be embraced therein.

What is claimed is:

1. A signal transmission device having an automatic transmission level control circuit used in a multi-carrier combination system, comprising:
   a variable attenuator for controlling a level of a transmission signal.;
   a transmission circuit including a local oscillation circuit generating a local oscillation signal, said transmission circuit being coupled to the variable attenuator and including modulating means for modulating said local oscillation signal with an output of the variable attenuator and for outputting a modulated radio frequency signal;
   a detection circuit including a diode having a square-law characteristic region provided with said modulated radio frequency signal for detecting a level of the modulated radio frequency signal by the square-law characteristic region and for generating a detection voltage corresponding to the detection level;

a reference voltage generating circuit for receiving an information signal indicative of a number of carriers for generating a reference voltage corresponding to the number of carriers;

a first control circuit provided with the detection voltage and the reference voltage for generating and supplying to the variable attenuator a first control signal of a difference between the detection voltage and the reference voltage; and a second control circuit provided with the information signal indicative of the number of carriers for generating and supplying to the detection circuit a second control signal corresponding to the number of carriers so that the square-law characteristic region of the diode in the detection circuit is shifted in correspondence to the second control signal to thereby enlarge a dynamic range of the detection circuit for level detection.

2. A signal transmission device as claimed in claim 1; wherein said variable attenuator comprises an attenuator having PIN diodes connected in $\pi$-type, and the impedances of the PIN diodes are controlled by the first control signal, thereby to vary the level of a transmission signal.

3. A signal transmission device as claimed in claim 1; wherein said modulating means of said transmission circuit comprises a mixer circuit provided with the output of the variable attenuator, said local oscillation circuit providing the local oscillation signal to the mixer circuit, whereby the mixer circuit generates the modulated radio frequency signal.

4. A signal transmission device as claimed in claim 1; wherein said reference voltage generating circuit comprises a ROM (read only memory) for storing digital signals which are determined according to the number of carriers and are read out from said ROM (read only memory) by a parallel data of N bits showing the number of carriers; and a D/A converter which outputs an analog signal as the reference voltage corresponding to the digital signals read out of the ROM.

5. A signal transmission device as claimed in claim 1; wherein said second control circuit comprises a D/A converter which receives the information signal indicative of the number of carriers of the N-bit parallel data and generates an analog signal corresponding to the N-bit parallel data; and a comparator circuit which compares the analog signal with a predetermined value to determine the value of the control voltage Vo according to the result of the comparison.

6. A signal transmission device as claimed in claim 5; wherein the diode in the detection circuit is provided with a bias voltage corresponding to the size of the control voltage Vo thereby to shift the square-law characteristic region of the diode.

7. A signal transmission device having an automatic transmission level control circuit used in a multi-carrier communication system, comprising:

a variable attenuator for controlling a level of a transmission signal;

a transmission circuit including means for generating a local oscillation signal and being coupled to the output of the variable attenuator for modulating said local oscillation signal with the output of the variable attenuator and for generating a modulated output signal;

a first detection circuit including a first diode having a first square-law characteristic region provided with the modulated output signal for detecting a first level of the modulated output signal and for generating a first detection voltage corresponding to the detected first level;

a second detection circuit including a second diode having a second square-law characteristic region provided with the modulated output signal for detecting a second level of the modulated output signal and for generating a second detection voltage corresponding to the detected second level;

a reference voltage generating circuit for receiving an information signal indicative of the number of carriers for generating a reference voltage corresponding to the number of carriers;

a first control circuit provided with a detection voltage and the reference voltage for generating and supplying to the variable attenuator a first control signal of a difference between the detection voltage and the reference voltage;

a second control circuit provided with the information signal indicative of the number of carriers for generating a second control signal corresponding to the number of carriers; and a switch circuit provided with the second control signal from the second control circuit for receiving the first and second detection voltage and for selecting and outputting to the first control circuit either one of the first and second detection voltage as the detection voltage according to the second control signal.

8. A signal transmission device as claimed in claim 7; wherein said variable attenuator comprises an attenuator having PIN diodes connected in $\pi$-type, and the impedances of the PIN diodes are controlled by the first control signal, thereby to vary the level of a transmission signal.

9. A signal transmission device as claimed in claim 7; wherein said transmission circuit comprises a mixer circuit provided with the output of the variable attenuator and said means for generating a local oscillation signal comprises a local oscillation circuit which provides the local oscillation signal to the mixer circuit so that the mixer circuit generates the modulated output signal.

10. A signal transmission device as claimed in claim 7; wherein said reference voltage generating circuit comprises a ROM (read only memory) for storing digital signals which are determined according to the number of carriers and the second control signal supplied from the second control circuit and outputting the digital signals by a parallel data of N bits showing the number of carriers; and a D/A converter which outputs an analog signal as the reference voltage corresponding to the digital signals read out of the ROM.

11. A signal transmission device as claimed in claim 7; wherein said second control circuit comprises a D/A converter which receives the information signal showing the number of carriers of the N-bit parallel data and generates an analog signal corresponding to the N-bit parallel data, and a comparator circuit which compares the analog signal with a predetermined value to determine the value of the control voltage Vo according to the result of the comparison.

12. A signal transmission device as claimed in claim 11;
wherein a bias voltage is applied to the diode in each detection circuit, said bias voltage being varied depending on the value of the control voltage Vo thereby to shift the square-law characteristic region of the diode.

13. Multi-carrier transmission terminal equipment used in a satellite communication system, comprising:
a plurality of signal sources;
a connection controller;
a modem having a plurality of modulators on a transmission side, each modulator being connected with one of the signal sources under control of the connection controller and being respectively supplied with an assigned carrier for modulating the assigned carrier with the output of connected signal source, and a mixer circuit connected to the modulators for mixing the outputs of the modulators;
a signal transmission device having an input terminal which is provided with the output of the mixed outputs of the modulators from the mixer circuit, the signal transmission device further including a variable attenuator for controlling a level of the mixed outputs of the modulators, a transmission circuit generating a local oscillation signal and being coupled to the output of the variable attenuator for modulating the local oscillation signal with the output of the variable attenuator and for generating a modulated output signal, a detection circuit including a diode having a square-law characteristic region provided with the modulated output signal for detecting a level of the modulated output signal by the square-law characteristic region and for generating a detection voltage corresponding to the detected level, a reference voltage generating circuit for receiving an information signal indicative of a number of carriers and for generating a reference voltage corresponding to the number of carriers, a first control circuit provided with the detection voltage and the reference voltage for generating and supplying to the variable attenuator a first control signal of a difference between the detection voltage and the reference voltage, and a second control circuit provided with the information signal indicative of the number of carriers for generating and supplying to the detection circuit a second control signal corresponding to the number of carriers so that the square-law characteristic region of the diode in the detection circuit is shifted in correspondence to the second control signal; and
an antenna provided with the modulated output signal of the transmission circuit of the transmission device.

14. Multi-carrier transmission terminal equipment as claimed in claim 13:
wherein said variable attenuator comprises an attenuator having PIN diodes connected in $\pi$-type, and the impedances of the PIN diodes are controlled by the first control signal, thereby to vary the level of a transmission signal.

15. Multi-carrier transmission terminal equipment as claimed in claim 13:
wherein said transmission circuit comprises a mixer circuit provided with the output of the variable attenuator and further comprises a local oscillation circuit which provides the local oscillation signal to the mixer circuit, whereby the mixer circuit generates the modulated output signal.

16. Multi-carrier transmission terminal equipment as claimed in claim 13:
wherein said reference voltage generating circuit comprises a ROM (read only memory) storing digital signals which are determined according to the number of carriers and the second control signal supplied from the second control circuit and outputing the digital signals by a parallel data of N bits showing the number of carriers, and further comprises a D/A converter which outputs an analog signal as the reference voltage corresponding to the digital signals read out of the ROM.

17. Multi-carrier transmission terminal equipment as claimed in claim 13;
wherein said second control circuit comprises a D/A converter which receives the information signal indicative of the number of carriers of N-bit parallel data, and a comparator circuit which compares the analog signal with a predetermined value to determine the value of the control voltage Vo according to the result of the comparison.

18. Multi-carrier transmission terminal equipment as claimed in claim 13:
wherein the diode in the detection circuit is provided with a bias voltage corresponding to the size of the control voltage Vo thereby to shift the square-law characteristic region of the diode.

* * * * *